United States Patent
Seo

(10) Patent No.: US 10,511,164 B2
(45) Date of Patent: Dec. 17, 2019

(54) APPARATUS FOR PREVENTING ELECTRIC SHOCK IN EVENT OF FLOODING AND METHOD THEREFOR

(71) Applicant: AMS CO., LTD, Gunpo-si (KR)

(72) Inventor: Mi Suk Seo, Uiwang-si (KR)

(73) Assignee: AMS CO., LTD, Gunpo-si (KR)

( * ) Notice: Subject to any disclaimer, the term of this patent is extended or adjusted under 35 U.S.C. 154(b) by 344 days.

(21) Appl. No.: 15/556,701

(22) PCT Filed: Mar. 15, 2016

(86) PCT No.: PCT/KR2016/002587
§ 371 (c)(1),
(2) Date: Sep. 8, 2017

(87) PCT Pub. No.: WO2016/153210
PCT Pub. Date: Sep. 29, 2016

(65) Prior Publication Data
US 2018/0109104 A1    Apr. 19, 2018

(30) Foreign Application Priority Data

Mar. 20, 2015  (KR) .................. 10-2015-0039061
Feb. 16, 2016  (KR) .................. 10-2016-0017780

(51) Int. Cl.
*H02H 9/00*  (2006.01)
*G01R 27/02*  (2006.01)
(Continued)

(52) U.S. Cl.
CPC ............. *H02H 9/005* (2013.01); *G01R 27/02* (2013.01); *G01R 31/02* (2013.01); *H01M 10/44* (2013.01);
(Continued)

(58) Field of Classification Search
CPC ....... G01R 27/02; G01R 31/02; H01M 10/44; H02H 9/005; H02H 9/08; H02H 3/162; H02J 7/04
(Continued)

(56) References Cited

U.S. PATENT DOCUMENTS

| 4,156,884 A * | 5/1979 | Eckart ................ H02H 3/331 |
| | | 361/46 |
| 5,867,358 A * | 2/1999 | Campbell ............. H02H 9/08 |
| | | 361/104 |
| 2015/0326004 A1* | 11/2015 | Curtis .................. H02H 3/162 |
| | | 361/47 |

FOREIGN PATENT DOCUMENTS

| JP | 2004-219328 | 8/2004 |
| JP | 2006-308422 | 11/2006 |

(Continued)

*Primary Examiner* — Kevin J Comber
(74) *Attorney, Agent, or Firm* — Lex IP Meister, PLLC

(57) ABSTRACT

The present technology relates to an apparatus for preventing electric shock in the event of flooding and a method therefor. To this end, the apparatus for preventing electric shock in the event of flooding may comprise: a transformer for supplying a voltage using a neutral grounding method in a single-phase two-wire low-voltage power distribution system; an earth leakage circuit breaker connected to power output from the transformer, an electric currents measurement unit for measuring the amount of electric currents passing through the earth leakage circuit breaker, a control unit for calculating the contact resistance to be compensated for, using the amount of electric currents from the electric currents measurement unit, and transmitting a control signal corresponding thereto; and a contact resistance compensation unit for compensating for the contact resistance according to the control signal from the control unit.

10 Claims, 16 Drawing Sheets

(51) Int. Cl.
*H02H 3/16* (2006.01)
*H02H 9/08* (2006.01)
*G01R 31/02* (2006.01)
*H01M 10/44* (2006.01)
*H02J 7/04* (2006.01)

(52) U.S. Cl.
CPC .............. *H02H 3/162* (2013.01); *H02H 9/08* (2013.01); *H02J 7/04* (2013.01)

(58) Field of Classification Search
USPC ........................................................ 361/212
See application file for complete search history.

(56) References Cited

FOREIGN PATENT DOCUMENTS

| KR | 10-2010-0138006 | 12/2010 |
|----|-----------------|---------|
| KR | 10-1396414 | 5/2014 |
| KR | 10-2014-0108384 | 9/2014 |

\* cited by examiner

→ direction of electric current by a voltage of 220V
> direction of electric current by a voltage of upper 110V
≫ direction of electric current by a voltage of lower 110V

APPARATUS FOR PREVENTING ELECTRIC SHOCK IN EVENT OF FLOODING AND METHOD THEREFOR

TECHNICAL FIELD

Some embodiments according to the present invention relate to an apparatus for preventing electric shock in an event of flooding and a method therefor. More particularly, the present invention relates to an apparatus for preventing electric shock in an event of flooding and a method therefor, including: applying a neutral grounding system in a single-phase two-wire low-voltage power distribution system; preventing an occurrence of leakage current by compensating for the difference in contact resistance value arising from the difference in surface area of exposed terminals of electrical equipment; and preventing a breaking operation of an earth leakage circuit breaker and electric shock by compensating for the difference in the amount of electric current between two power supply lines due to earth leakage.

The apparatus in some embodiments according to the present invention may be adapted to all electrical equipment such as a street light, an electric motor, a high voltage transformer, a traffic signal control unit, agricultural equipment, and so on.

BACKGROUND ART

In general, there are several low-voltage power distribution systems such as a single-phase two-wire low-voltage power distribution system, a single-phase three-wire low-voltage power distribution system, and a three-phase four-wire low-voltage power distribution system (called a first conventional technique hereafter).

First, referring to the single-phase two-wire low-voltage power distribution system with reference to FIG. 1, FIG. 1 is a view illustrating a conventional single-phase two-wire low-voltage power distribution system. The system has an output voltage of 220V being drawn between a plus (+) terminal and a minus (−) terminal as illustrated in FIG. 1, wherein a grounding system with a grounding side connected to the minus terminal is applied.

Next, referring to the single-phase three-wire low-voltage power distribution system the majority of electrical equipment was configured for 110V in the past. However, as industrialization progressed rapidly, 220V was adopted. Accordingly, a new low-voltage power distribution system was needed in order to use existing 110V electrical equipment and 220V electrical equipment newly produced. To meet the need, the single-phase three-wire low-voltage power distribution system was introduced.

Next, referring to the three-phase four-wire low-voltage power distribution system, as industrialization progressed, the demand for three-phase electrical power appropriate for the large electric power load increased. Accordingly, the demand for the three-phase four-wire low-voltage power distribution system increased proportionally, since the distribution system can supply three-phase electrical power and single-phase at the same time. These days, as a result, the three-phase four-wire low-voltage power distribution system is widely used in a majority of low-voltage power distribution systems.

FIG. 2 is a view illustrating a conventional three-phase four-wire low-voltage power distribution system. Terminals of R, S, and T depicted in FIG. 2 are used by connecting them to a 380V three-phase electric motor, and 220V can be drawn by combining one of the terminals of R, S, and T with terminal N.

In the use of electricity in general, however, 220V electricity drawn from the single-phase two-wire low-voltage power distribution system, the single-phase three-wire low-voltage power distribution system, or the three-phase four-wire low-voltage power distribution system seems all the same, but characteristics of electricity drawn from each system are significantly different from one another from the point of view of the property of grounding system. Referring to the single-phase three-wire low-voltage power distribution system and the three-phase four-wire low-voltage power distribution system as examples, with reference to FIG. 3, is as follows.

FIG. 3 is a view illustrating electrical outlets in the conventional single-phase three-wire low-voltage power distribution system and the conventional three-phase four-wire low-voltage power distribution system.

First, in the case of the electrical outlet in the three-phase four-wire low-voltage power distribution system, 220V appears when the voltage between a terminal 1 and a terminal 3, earth, is measured and 0V appears when the voltage between a terminal 2 and the terminal 3 is measured.

Next, in the case of the electrical outlet in the single-phase three-wire low-voltage power distribution system, 110V appears when the voltage between a terminal 1 and the terminal 3, earth, is measured and 110V appears also when the voltage between a terminal 2 and the terminal 3 is measured.

As can be seen from the description above, a voltage to ground of the single-phase three-wire low-voltage power distribution system is different from a voltage to ground of the three-phase four-wire low-voltage power distribution system.

FIG. 4a is a view illustrating the result of a voltage to ground measured in the event of flooding in a conventional single-phase two-wire low-voltage power distribution system; FIG. 4b is a view illustrating the state of leakage current being measured by using an ammeter in the event of flooding in a conventional single-phase two-wire low-voltage power distribution system; FIG. 4c is an equivalent circuit of FIG. 4b; and FIG. 4d is a view illustrating the flow of momentary electric current in an equivalent circuit of FIG. 4c.

As illustrated in FIG. 4a, two lines extend to a plastic pool from output terminals of plus and minus of 220V power supply lines drawn from the conventional single-phase two-wire low-voltage power distribution system; the two lines are immersed into water in the plastic pool; and one end side of another line is immersed into water in the pool away about 1 m from the two lines of plus and minus. When a voltage between water and an earth terminal is measured, 110 V, half of 220 V, appears. Consequently, when a person touches water and the earth terminal at the same time with his or her hand, the large amount of momentary electric current flows and may cause electric shock. As illustrated in FIG. 4b, at this time, electric current being leaked out can be measured with an ammeter installed between the water and the earth terminal.

Assuming about 3 Ω of earth resistance exists between two places of the earth of FIG. 4b, an equivalent circuit of FIG. 4b can be depicted as FIG. 4c.

At this time, referring to the flow of momentary electric current in an equivalent circuit, with reference to FIG. 4d, according to a direction of electromotive force by a voltage of 220 V, electric current flows along a path a and a path b, and then a path c. That is, in the flow of electric current, because they flow without offset of their forces each other, the ammeter displays a value indicating a huge amount of electric current. Therefore, when a person is positioned at the location of the ammeter (i.e., when a person touches water and the earth terminal at the same time) the large amount of momentary electric current flows and may cause electric shock.

The ground systems of the conventional single-phase two-wire low-voltage power distribution system and the three-phase four-wire low-voltage power distribution system have a critical drawback, namely: when an earth leakage circuit breaker operates normally in the event of flooding of electrical equipment, the electrical equipment loses the electrical power resulting in no operation; and when the earth leakage circuit breaker does not operate normally in the event of flooding of the electrical equipment, very high risk of an electric shock accident exists due to the large amount of electric current leaking to outside.

Meanwhile, Korean unexamined patent publication No. 10-2005-0037986 (called a second conventional technique, hereafter) depicts an anti-electric shock system in water immersion for preventing accidents due to earth leakage or electric shock by absorbing a leakage current leaking out from a bare current carrying part (current carrying part due to the absence of a sheath), when electrical equipment is flooded while electric current is carried. The anti-electric shock system in water immersion of the second conventional technique is illustrated into several embodiments. A common feature of the embodiments is that a flat plate metal board having area large enough to cover all other devices such as circuit breakers, stabilizer, etc. including a connection terminal board disposed with exposed connection terminals (single-phase connection terminal P, neutral point terminal N, earth terminal E) is connected to the neutral terminal (N) or the earth terminal (E), wherein the flat plate metal board is disposed at the bottom surface of the connection terminal board, circuit breakers, stabilizers, etc. while being electrically connected to the terminals of N or E.

According to a description of the second conventional technique, when exposed connection terminals of the connection terminal board are immersed into water, thanks to the configuration described, most electric current leaking out through bare current carrying part flows via the flat plate metal board. Therefore, when a person touches water, intensity of electric current flowing through human body is so weak that accidents due to electric shock or earth leakage can be prevented.

However, according to an experiment performed by manufacturing an anti-electric shock system in water immersion identical with the second conventional technique, the second conventional technique has a critical vulnerable point.

Firstly, in order to realize a prevention effect of earth leakage and electric shock, the metal board for the prevention of earth leakage should be connected to the neutral point terminal of AC power supply, but perfect assurance of this is problematic. According to the description of second conventional technique, in order to realize a prevention effect of earth leakage in the event of flooding, the flat plate metal board should be connected to the neutral point terminal or earth terminal of AC power supply. One way to achieve this is by, when the connection terminal board is installed, locating in advance the first power supply line that is connected to the neutral point terminal of power supply side out of two single-phase (1P) AC power supply lines, whereby the located line is connected to connection terminal to which flat plate metal board is connected, and the other second power supply line is connected to remaining connection terminal. However, this approach has several problems: location of the first power supply line that is connected to the neutral point terminal of power supply side is cumbersome; the prevention of earth leakage and electric shock cannot be achieved when connection is not performed properly with right line to the right terminal; and electrical power is wasted by connecting the electrical power load all the time to the power supply side even in the case the electrical power load does not need electrical power. To connect the electrical power load to the electrical power supply side only for the duration required as necessary, a plug and an electrical outlet may be considered to be disposed between the electrical power supply side and the connection terminal board. In this case, the path the metal board is electrically connected to the electrical power supply side becomes the terminal of the connection terminal board→ the plug terminal→ the electrical outlet. At this time, for the flat plate metal board to be connected to the neutral point terminal of the AC power supply, the plug terminal connected to the first connection terminal (J1) of the connection terminal board to which the flat plate metal board is connected should be perfectly assured to connect with electrical outlet terminal connected to the neutral point terminal of the AC power supply side. The plug has two plug terminals (IN1, IN2), which look the same, and one earth terminal (G), each electrically connected to each of three terminals of the connection terminal board. Furthermore, two electrical outlet terminals, to which AC power supply is provided, that is, the first electrical outlet terminal (N) connected to the neutral terminal of the AC power supply and the second terminal (R) connected to the single-phase voltage terminal look the same as well. Therefore, to correctly connect the first plug terminal (IN1) with the first electrical outlet terminal (N) when a user puts the plug into the electrical outlet, the user should know which one of the two plug terminals is the first plug terminal (N) and which one is the first electrical outlet terminal (N). In reality, however, assurance of these conditions is very difficult. Even a user who knows polarities of the plug and the electrical outlet terminal may commit a mistake of not connecting with the right polarity when not paying attention. Marking polarity on the plug terminal and the electrical outlet terminal is one way to prevent the user error, but a user who does not know this may put the plug into the electrical outlet. Considering the possibility of errors induced by inadvertence, this approach also has drawbacks.

Also, even though the second conventional technique describes the same effect is achieved when the metal board for the prevention of the earth leakage is connected to the earth terminal (E), according to the experiment, when the metal board for the prevention of the earth leakage is connected to the earth terminal (E), not to the neutral point terminal (N), the desired effect of preventing earth leakage and electric shock is unable to be achieved.

Secondly, a conductive metal board proposed by the second conventional technique is unable to provide prevention function of earth leakage and electric shock in the event of flooding, which is a fact different from what the second conventional technique claims. According to the results verified through various tests, the cause was identified as the flat plate structure of the conductive metal board for the prevention of earth leakage. According to the experiment, as proposed by the second conventional technique, the configuration, with the large flat plate metal board disposed beneath the connection terminal board and so on, causes an increase in the amount of leaking electric current in a few seconds to several ten seconds after the connection terminal board is immersed into water. This causes the earth leakage circuit breaker to actuate and then the electrical power supply to electrical power load is cut. At this time, a person felt the impact of electric shock as he put his hand into water that the connection terminal board was immersed in. The causes of this are: the distance between the conductive metal board for the prevention of earth leakage and the second connection terminal connected to the single-phase voltage terminal is excessively far; and the body of the connection terminal board consisted of insulating material disposed between them contributes to increase the resistance value between them by disturbing the electric current to flow via the shortest path. Consequently, even though a small portion of the electric current leaking out from the second connection terminal flows into the conductive metal board for the prevention of earth leakage, the remaining substantial amount of electric current leaks out to other place. Though the second conventional technique proposed the size of the flat plate conductive board for the prevention of earth leakage as 50 ▯×30 ▯ when operational voltage is 380 V, according to the experiment, when a conductive board far bigger than the above (for example, 60 ▯×60 ▯) is used, the earth leakage circuit breaker is actuated even though the breaker actuation time became a little longer. As such, it was recognized that the problem could not be resolved by increasing the size of the conductive board. In reality, due to the limitation of the space where the conductive board can be installed, the size of the conductive board cannot be increased indefinitely. Therefore, the second conventional technique has a drawback that cannot be resolved by increasing the size of the conductive board.

As described above, the first conventional technique has the following problems: when an earth leakage circuit breaker operates normally in the event of flooding of electrical equipment, the electrical equipment loses the electrical power resulting in no operation; and when the earth leakage circuit breaker does not operate normally in the event of flooding of the electrical equipment, very high risk of an electric shock accident exists due to the large amount of electric current leaking to outside. The second conventional technique has a problem of being unable to provide prevention effect of earth leakage and electric shock. To resolve these problems, a third conventional technique (refer to FIG. 5 to FIG. 7) described below has been developed by the inventor.

FIG. 5 is a view illustrating a transformer using a conventional neutral grounding system and a method therefor.

As illustrated in FIG. 5, the third conventional technique includes the transformer 50 using a conventional neutral grounding system in the single-phase two-wire low-voltage power distribution system. That is, the third conventional technique uses a neutral grounding system connecting a neutral point 51 (middle position of a secondary winding) of the secondary winding (winding of the output side) to a ground wire 52 in the single-phase two-wire low-voltage power distribution system comprised of a single-phase (1P) input side and a two-wire output side. Other transformation technologies are not described further in detail here since they are related arts.

As illustrated in FIG. 5, when the neutral grounding system is applied in the single-phase two-wire low-voltage power distribution system, in the event of flooding of exposed terminals of electrical equipment, electric current flows between plus polarity terminals, i.e., electric current flows from plus (+) polarity terminal to minus (−) polarity terminal whereby their respective forces offset each other, resulting in almost no leaking electric current to outside except the area between the plus polarity terminals and a vicinity thereof (refer to FIG. 6a to FIG. 6d, described later).

FIG. 6a is a view illustrating the result of a voltage to ground measured in the event of flooding in a conventional single-phase two-wire low-voltage power distribution system, wherein the system uses a neutral grounding system; FIG. 6b is a view illustrating the state of earth leakage being measured by using an ammeter in the event of flooding in a conventional single-phase two-wire low-voltage power distribution system, wherein the system uses a neutral grounding system; 6c is an equivalent circuit of FIG. 6b; and FIG. 6d is a view illustrating the flow of momentary current in an equivalent circuit of FIG. 6c.

As illustrated in FIG. 6a, two lines extend to a plastic pool from output terminals of plus and minus of 220V power supply lines drawn from the neutral grounding system in the single-phase two-wire low-voltage power distribution system; the two lines are immersed into water in the plastic pool; and one end side of another line is immersed into water in the pool away about 10 ▯ from the two lines of plus and minus. When a voltage between water and the earth terminal is measured, a voltage equal to or less than 10V appears. More specifically, a voltage of 4V to 10V appears. Therefore, since it is generally known that electric shock does not occur at a voltage less than 30 V, when a person touches the water and the earth terminal at the same time with his or her hand, a negligible amount of electric current flows and the electric shock is prevented. As illustrated in FIG. 6b, it can be verified at this time that almost no electric current flows by measuring the leakage current with the ammeter installed between water and the earth terminal.

Assuming about 3 ▯ of earth resistance between two places of the earth of FIG. 6b, an equivalent circuit of FIG. 6b can be depicted as FIG. 6c.

At this time, referring to the flow of momentary current in an equivalent circuit, with reference to FIG. 6d, according to a direction (for example, top to bottom in FIG. 6d) of electromotive force by a voltage of 220 V, electric current flows along a path g and then a path i through the water. Examining this in more detail shows the voltage between the terminal d and the terminal e is 220V. Since a potential difference between the terminal d and the terminal e is 220V and a first closed loop (path g–conducting wire of water–path i) is formed with water in the plastic pool as a conducting wire like this, naturally current by the voltage of 220V flows along the first closed loop.

Meanwhile, the voltage between the terminal d and the terminal f and between the terminal f and the terminal e is 110 V, respectively. Like this, a potential difference between the terminal d and the terminal f and between the terminal f and the terminal e is 110 V, respectively, and a second closed loop (path g–conducting wire of water–path h) and a third closed loop (path h–conducting wire of water–path i) as a conducting wire is formed with water in the plastic pool, respectively. It would seem natural that electric current flows along the second closed loop and the third closed loop. However, almost no electric current flows since the voltages between the terminal d and the terminal f, and between the terminal f and the terminal e are identical with 110 V, but have opposite directions of electromotive forces from each other. That is, regarding the neutral point 51 as a reference point, since the upper direction 110V and lower direction 110V are identical each other and directions of electromotive forces by voltages of both sides are opposite each other from the point of ammeter's view, their forces offset each other almost completely and almost no electric current flows, thus the ammeter display indicates nearly zero.

Consequentially, when single-phase 220V of a neutral grounding system in the single-phase two-wire low-voltage power distribution system is applied to electrical equipment that may be exposed to flooding, a risk of electric shock can be greatly reduced when earth leakage circuit breaker does not operate due to fault or even primary side of the earth leakage circuit breaker is immersed into water. That is, electric shock can be fundamentally prevented by applying the neutral grounding system in the single-phase two-wire low-voltage power distribution system, wherein almost no leakage current flows out from the terminals to outside in the event that exposed terminals of electrical equipment are immersed into water FIG. 7 is a view to explain a means preventing an operation of a conventional earth leakage circuit breaker, wherein breaking operation prevention unit 720 is integrally embodied with earth leakage circuit breaker.

In general, the earth leakage circuit breaker 710 is a wiring appliance that automatically cuts the electricity by sensing a state in advance, wherein the state is when an input voltage higher than the nominal voltage is applied or earth leakage occurs at the electrical equipment. At this time, the earth leakage circuit breaker 710 should perform breaking operation within 0.03 second after the occurrence of earth leakage in the case of human body standard and should perform breaking operation within 0.1 second after the occurrence of earth leakage in the case of industrial standard. Since the earth leakage circuit breaker 710 like this is not to be described further in detail here since it is a related art. Only, the earth leakage circuit breaker 710 is connected to the power supply outputting from transformer 50 depicted in FIG. 5 and performs fundamentally the function to support the exposed terminal 721 of plus connected to the plus terminal and the exposed terminal 722 of minus connected to the minus terminal. In addition, it is desirable that the earth leakage circuit breaker 710 is waterproof.

At this time, earth leakage may occur in a general state other than flooding and in the event of flooding when the electrical equipment is immersed into water. When earth leakage occurs like this, the earth leakage circuit breaker 710 cuts the electrical power by actuating normally and the operation of electrical equipment that follows is stopped.

Meanwhile, as described above by referring to FIG. 5, and FIG. 6a to FIG. 6d, if it is possible to prevent the electric shock in the event that the exposed terminals of the electrical equipment are immersed into water by reducing greatly the leakage current leaking out from those terminals, it would be desirable to make such electrical equipment (especially, street light, traffic signal control unit, electrical outlet for the facility in the basement, agricultural equipment, etc.) operate normally by preventing the breaking operation of the earth leakage circuit breaker in the case of the occurrence of the electric shock due to the event of flooding.

Therefore, the third conventional technique includes the breaking operation prevention unit 720 to prevent the breaking operation of the earth leakage circuit breaker 710 by immersing the exposed plus and minus terminals into the water within the predetermined time (e.g., within 0.03 second), that is almost simultaneously.

At this time, the breaking operation prevention unit 720 prevents the breaking operation of the earth leakage circuit breaker 710: by installing the exposed terminal 721 of plus connected to the plus terminal and the exposed terminal 722 of minus connected to the minus terminal of the earth leakage circuit breaker 710 to space apart at a predetermined distance (for example, 7 ▮ to 8 ▮) between them and to keep balance of the bottoms thereof; and by allowing electric current to flow from the exposed terminal 721 of plus to the exposed terminal 722 of minus through the immersion of the exposed terminal 721 of plus and the exposed terminal 722 of minus into water within a predetermined time. That is, the breaking operation prevention unit 720 can prevent breaking operation by making the earth leakage circuit breaker 710 not to sense the electric shock state due to the event of flooding by making the bottoms of the exposed terminal 721 of plus and the exposed terminal 722 of minus be balanced (to be balanced the bottoms by using leveler when installed), thus they can be immersed into water simultaneously.

In addition, the breaking operation prevention unit 720 further includes a supporting structure 723 to maintain separation distance and balance of bottoms by supporting the exposed terminal 721 of plus and the exposed terminal 722 of minus. The breaking operation prevention unit 720 further includes a protection case 724 to protect the breaking operation prevention unit 720 from the velocity of the water, wherein the protection case 724 further includes a foreign substance inflow prevention unit 725. The protection case 724 further includes an air exhaust unit 726.

As such, the third conventional technique does not produce a leakage current even in the event that the exposed terminals are immersed into water when the neutral grounding system is applied in the single-phase two-wire low-voltage power distribution system.

Furthermore, in the conventional technique in most cases, usually, the amount of electric current between two power supply lines connected to electric power load is maintained in a balanced state, provided the amount of electric current between the lines is not balanced due to a leakage current, thus it has a problem that breaking operation is actuated and electric shock occurs.

DISCLOSURE

Technical Problem

However, in the third conventional technique as above, in most cases, the exposed left and right terminals are same types and contact resistance (resistance between the exposed surface areas and water when they contact in the event of flooding) thereof is almost same in many cases because their surface areas are almost same. In a case like this, a leakage current is not produced in the event of flooding. However, in the case that contact resistances of the terminals are different from each other due to the difference of their surface areas, the leakage current is produced in proportion to the difference in their contact resistance. The object of the present invention is to resolve such a problem.

In addition, another object of the present invention is to prevent the breaking operation of an earth leakage circuit breaker and electric shock due to the leakage current by compensating for the difference in the amount of current between two power supply lines while using the single-phase two-wire low-voltage power distribution system.

Accordingly, an embodiment according to this invention provides an apparatus for preventing electric shock in an event of flooding and a method therefor to prevent the an occurrence of earth leakage by compensating for the difference in contact resistance arising from the difference in surface area of exposed terminals of an electric equipment while applying the neutral grounding system in the single-phase two-wire low-voltage power distribution system.

In addition, another embodiment according to this invention provides an apparatus for preventing electric shock in an event of flooding and a method therefor to prevent the breaking operation of an earth leakage circuit breaker and electric shock due to the leakage current by compensating for the difference in the amount of current between two power supply lines due to the earth leakage while applying the neutral grounding system in the single-phase two-wire low-voltage power distribution system.

The objectives of the present invention are not limited to the objectives described above and other undescribed objectives and advantageous features of the present invention will become understandable through description below and will be known clearly by the embodiments according to the present invention. Furthermore, objectives and advantageous features of the present invention will be easily known by means and combinations thereof described in claims.

Technical Solution

An apparatus for preventing electric shock in an event of flooding according to the first embodiment of a method of the present invention may include: a transformer supplying a voltage by using a neutral grounding system in a single-phase two-wire low-voltage power distribution system; an earth leakage circuit breaker connected to power supply lines extending from the transformer; an electric current measurement unit measuring the amount of electric current passing through the earth leakage circuit breaker; a control unit outputting a control signal corresponding to a contact resistance to be compensated for the contact resistance being calculated by using the amount of electric current output from the electric current measurement unit; and a contact resistance compensation unit compensating for the contact resistance in response to the control signal output from the control unit.

Meanwhile, a method for preventing electric shock in an event of flooding according to the second embodiment of the present invention may include the steps of: supplying a voltage from a transformer to an earth leakage circuit breaker by using a neutral grounding system in a single-phase two-wire low-voltage power distribution system; measuring, by an electric current measurement unit, the amount of electric current passing through the earth leakage circuit breaker; outputting, from a control unit, a control signal corresponding to a contact resistance to be compensated for the contact resistance being calculated by using the amount of electric current output from the electric current measurement unit; and compensating, by a contact resistance compensation unit, for the contact resistance in response to the control signal output from the control unit.

Meanwhile, the apparatus according to the third embodiment of the present invention may include: a transformer supplying power to electrical power load via an earth leakage circuit breaker and a first and a second power supply lines, wherein the transformer uses a single-phase two-wire low-voltage power distribution system comprising a single-phase input side and a two-wire output side, and uses a neutral grounding system in which a neutral point of a secondary winding is connected to a ground wire; the earth leakage circuit breaker cutting the power supply to the electric power load by sensing when an input voltage equal to or greater than a nominal voltage is applied or earth leakage occurs; an earth leakage sensing unit outputting first and second earth leakage sensing signals corresponding to the amount of electric current, sensed by the sensing unit, flowing in the first and the second power supply lines; a microprocessor outputting first and second control signals in order to maintain electric current balancing between the first and the second power supply lines based on the first and the second earth leakage sensing signals; and a balance switching unit maintaining the electric current balancing between the first and the second power supply lines by controlling the amount of electric current of the first power supply line or the second power supply line via switching operation in response to the first control signal or the second control signal.

Meanwhile, the method according to the fourth embodiment of the present invention may include the steps of: (a) supplying power from a transformer to electric power load via an earth leakage circuit breaker and first and second power supply lines, wherein the transformer uses a single-phase two-wire low-voltage power distribution system comprising a single-phase input side and a two-wire output side, and uses a neutral grounding system in which a neutral point of a secondary winding is connected to a ground wire; (b) outputting, from an earth leakage sensing unit, first and second earth leakage sensing signals corresponding to the amount of electric current, sensed by the sensing unit, flowing in the first and the second power supply lines; (c) outputting, from a microprocessor, first and second control signals in order to maintain electric current balancing between the first and the second power supply lines based on the first and the second earth leakage sensing signals; and (d) maintaining, by a balance switching unit, the electric current balancing between the first and the second power supply lines by controlling the amount of electric current of the first power supply line or the second power supply line via switching operation in response to the first control signal or the second control signal.

Advantageous Effects

According to an embodiment according to this invention, an occurrence of leakage current can be prevented by compensating for the difference in contact resistance arising from the difference in surface area of exposed terminals of electrical equipment while using the neutral grounding system in the single-phase two-wire low-voltage power distribution system. Accordingly, there is an effect in that electric shock can be fundamentally prevented.

According to another embodiment according to this invention, there is an effect that can prevent the breaking operation of an earth leakage circuit breaker and electric shock due to the leakage current by compensating for the difference in the amount of current between two power supply lines arising from the earth leakage while using the neutral grounding system in the single-phase two-wire low-voltage power distribution system.

BEST MODE

In the following description of the present invention, detailed description of known technologies related to the present invention which has been deemed to make the subject matter of the present invention unnecessarily obscure will be omitted. Hereinafter, to fully describe the present invention for a person having ordinary knowledge in the art to which the present invention pertains to easily materialize the technical concept of the present invention, the most desirable embodiment according to the present invention will be described with reference to the accompanying drawings.

In the whole description, when it is described that a certain part is "connected", it includes not only the case "directly connected" but also the case "electrically connected", wherein another element is disposed between them. In addition, when it is described as a certain part "includes", or "has", it does not mean to exclude other element but to include or to have other element unless particularly described opposed to those described above. In addition, in describing the whole description, even though a certain element is described as singular, the present invention is not limited to this and an associated element can be identified being composed of a plurality.

Figure 1:
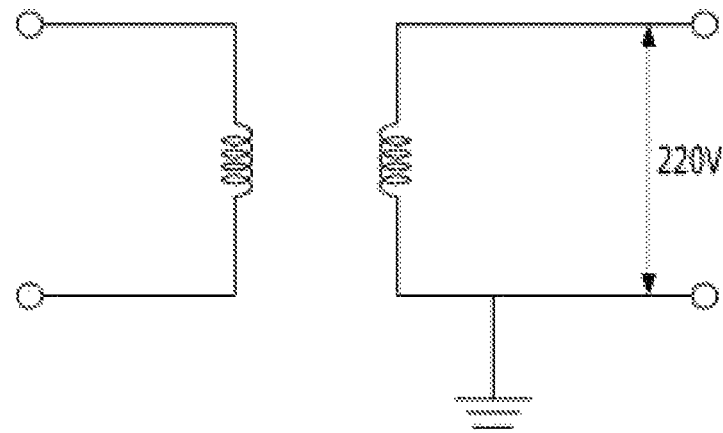
FIG. 1 is a view illustrating a conventional single-phase two-wire low-voltage power distribution system.
Figure 2:
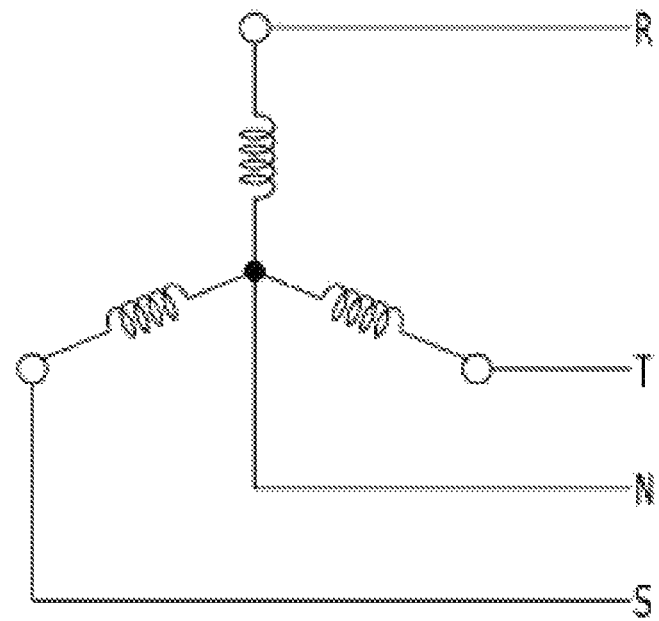
FIG. 2 is a view illustrating a conventional three-phase four-wire low-voltage power distribution system.
Figure 3:
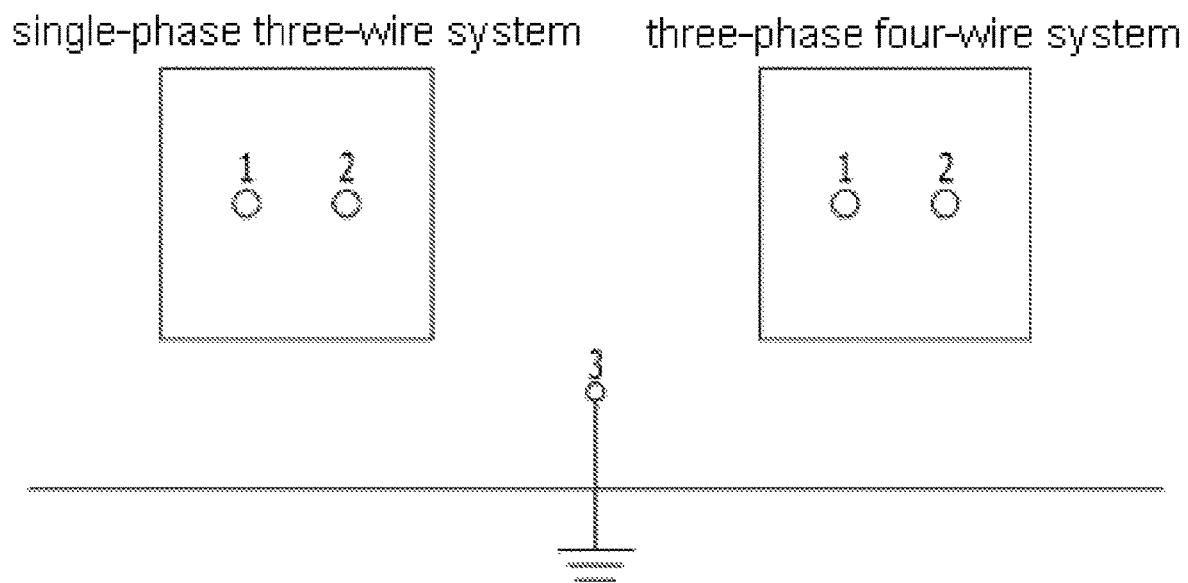
FIG. 3 is a view illustrating electrical outlets in a conventional single-phase three-wire low-voltage power distribution system and a conventional three-phase four-wire low-voltage power distribution system.
Figure 4A:
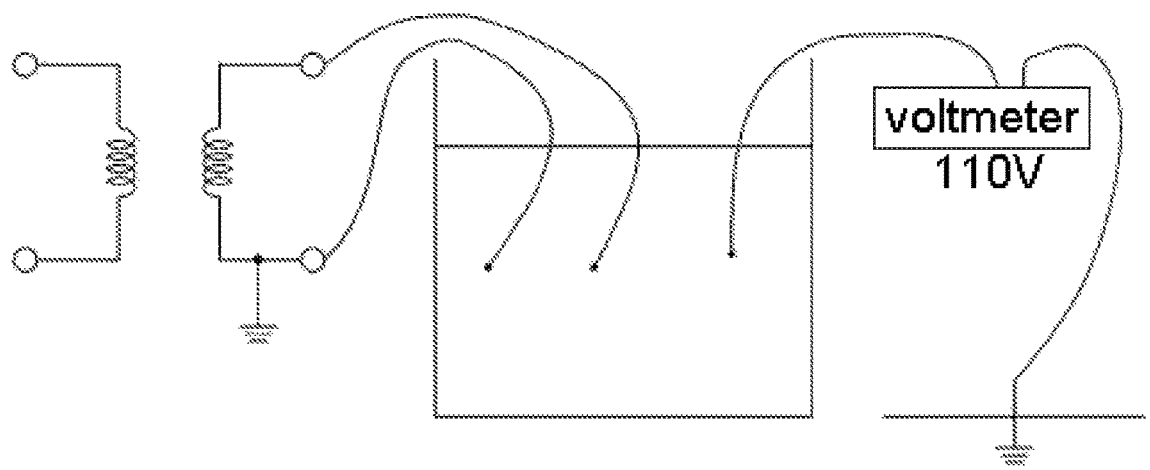
FIG. 4a is a view illustrating the result of a voltage to ground measured in the event of flooding in a conventional single-phase two-wire low-voltage power distribution system.
Figure 4B:
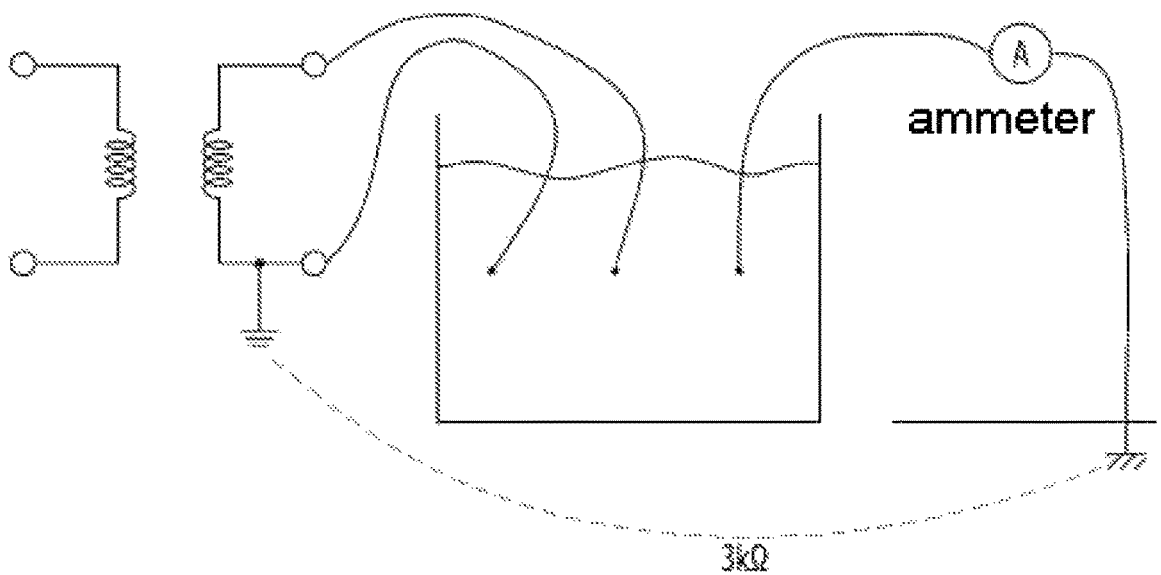
FIG. 4b is a view illustrating the state of measuring leakage current by using an ammeter in the event of flooding in a conventional single-phase two-wire low-voltage power distribution system.
Figure 4C:
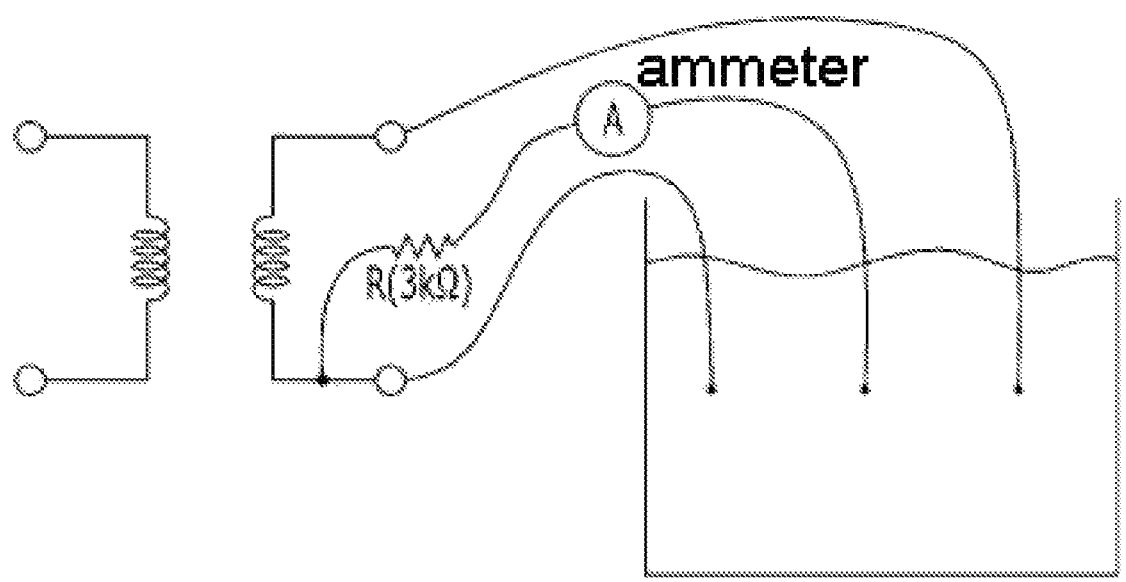
FIG. 4c is an equivalent circuit of FIG. 4b.
Figure 4D:
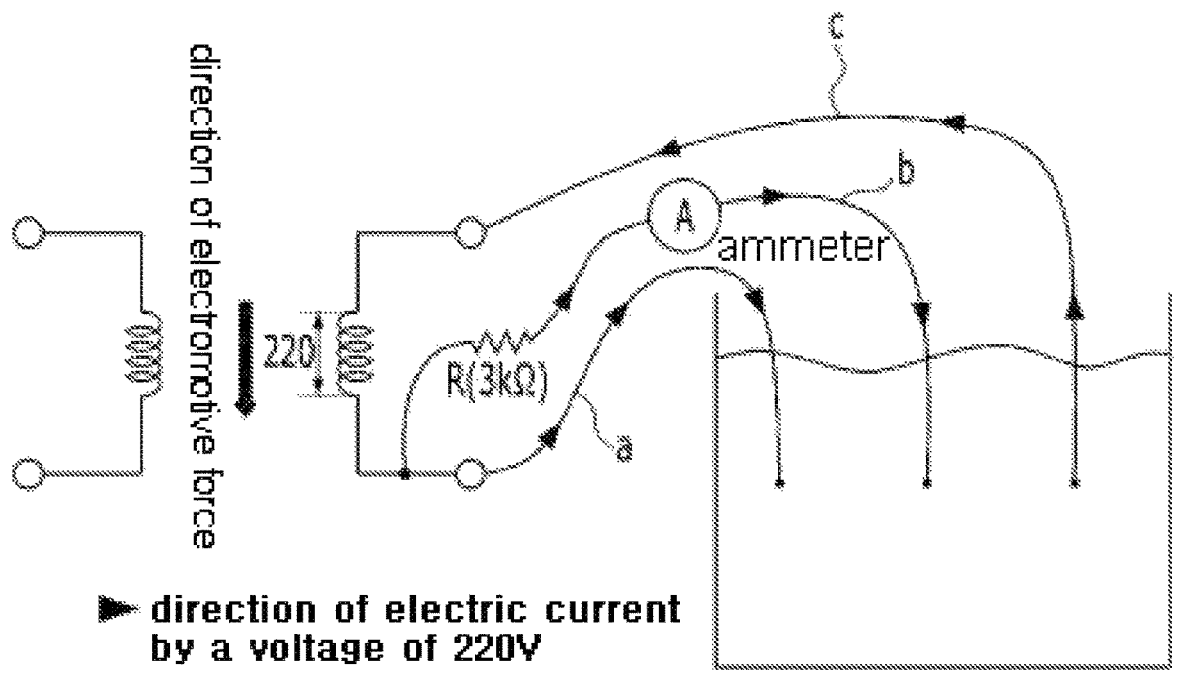
FIG. 4d is a view illustrating the flow of momentary current in an equivalent circuit of FIG. 4c.
Figure 5:
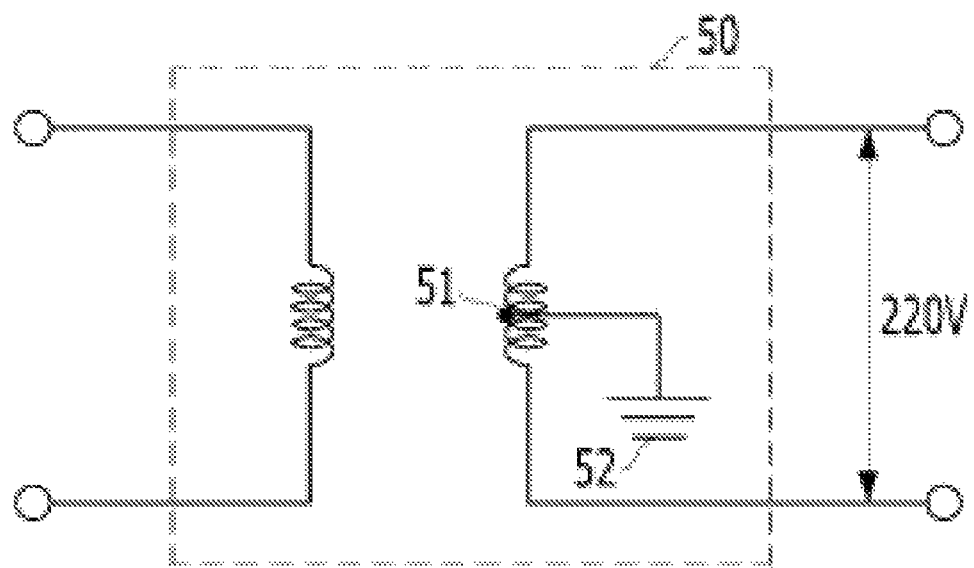
FIG. 5 is a view to explain a transformer using a conventional neutral grounding system and a method therefor.
Figure 6A:
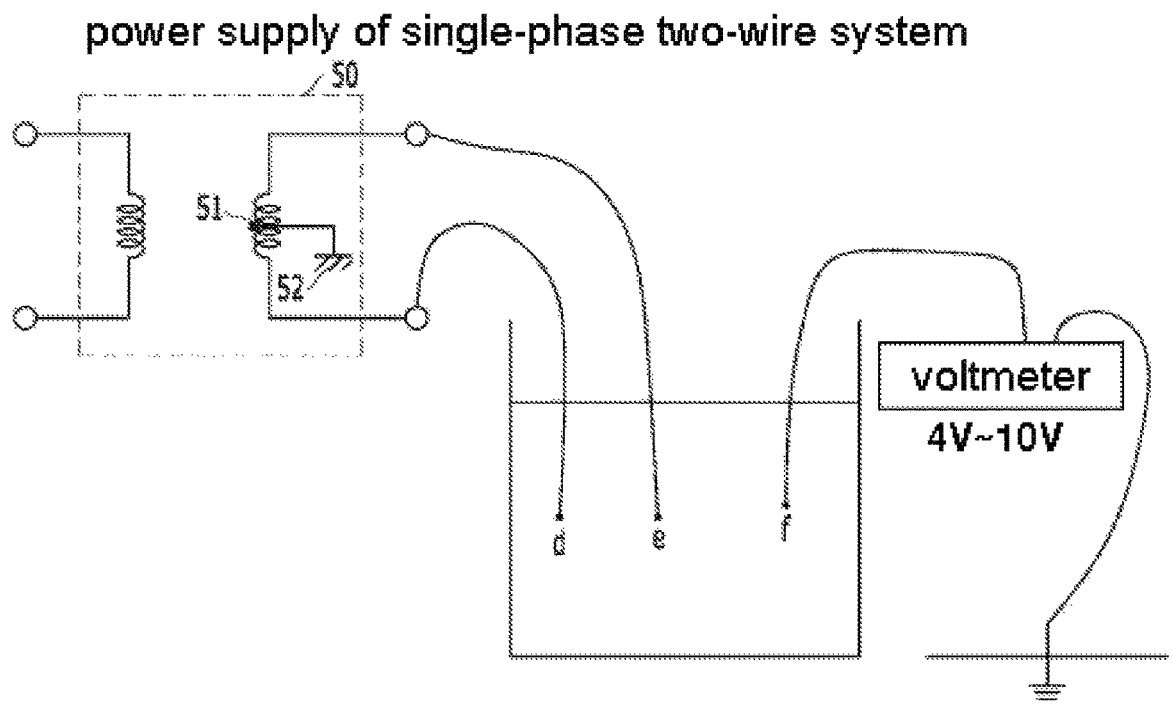
FIG. 6a is a view illustrating the result of a voltage due to earth leakage measured in the event of flooding in a conventional single-phase two-wire low-voltage power distribution system when it uses a neutral grounding system.
Figure 6B:
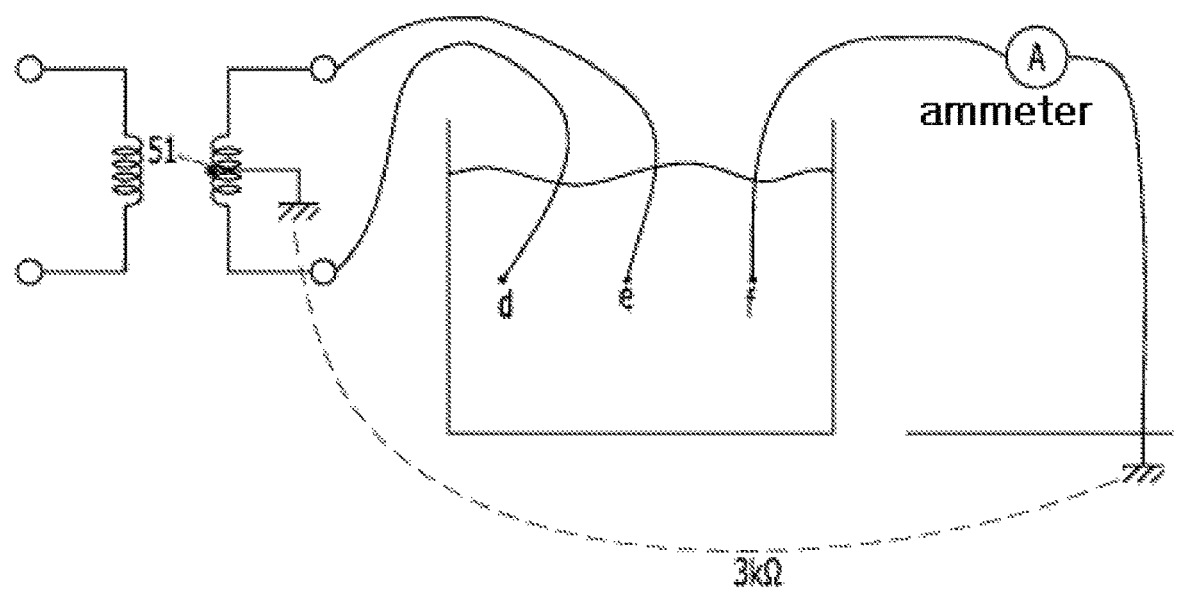
FIG. 6b is a view illustrating the state of earth leakage being measured by using an ammeter in the event of flooding in a conventional single-phase two-wire low-voltage power distribution system when it uses a neutral grounding system.
Figure 6C:
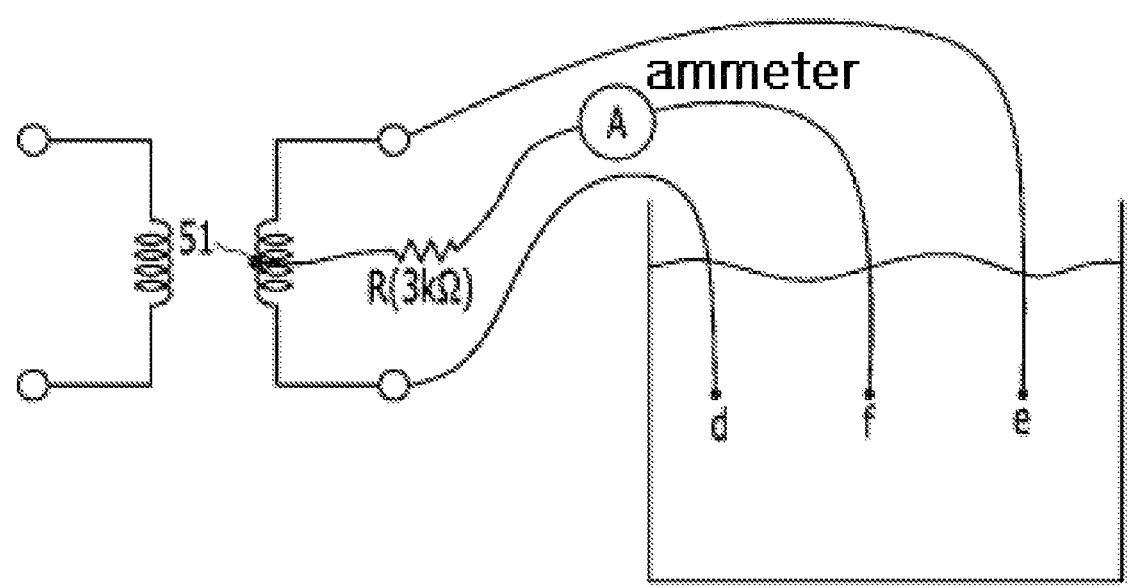
FIG. 6c is an equivalent circuit of FIG. 6b.
Figure 6D:
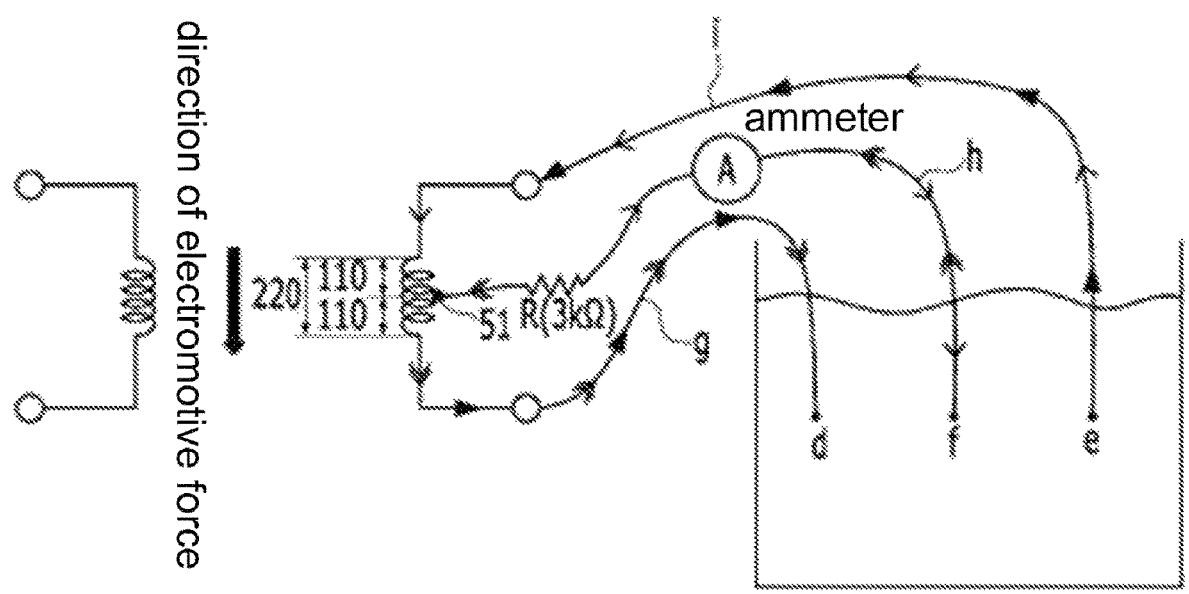
FIG. 6d is a view illustrating the flow of momentary current in an equivalent circuit of FIG. 6c.
Figure 7:
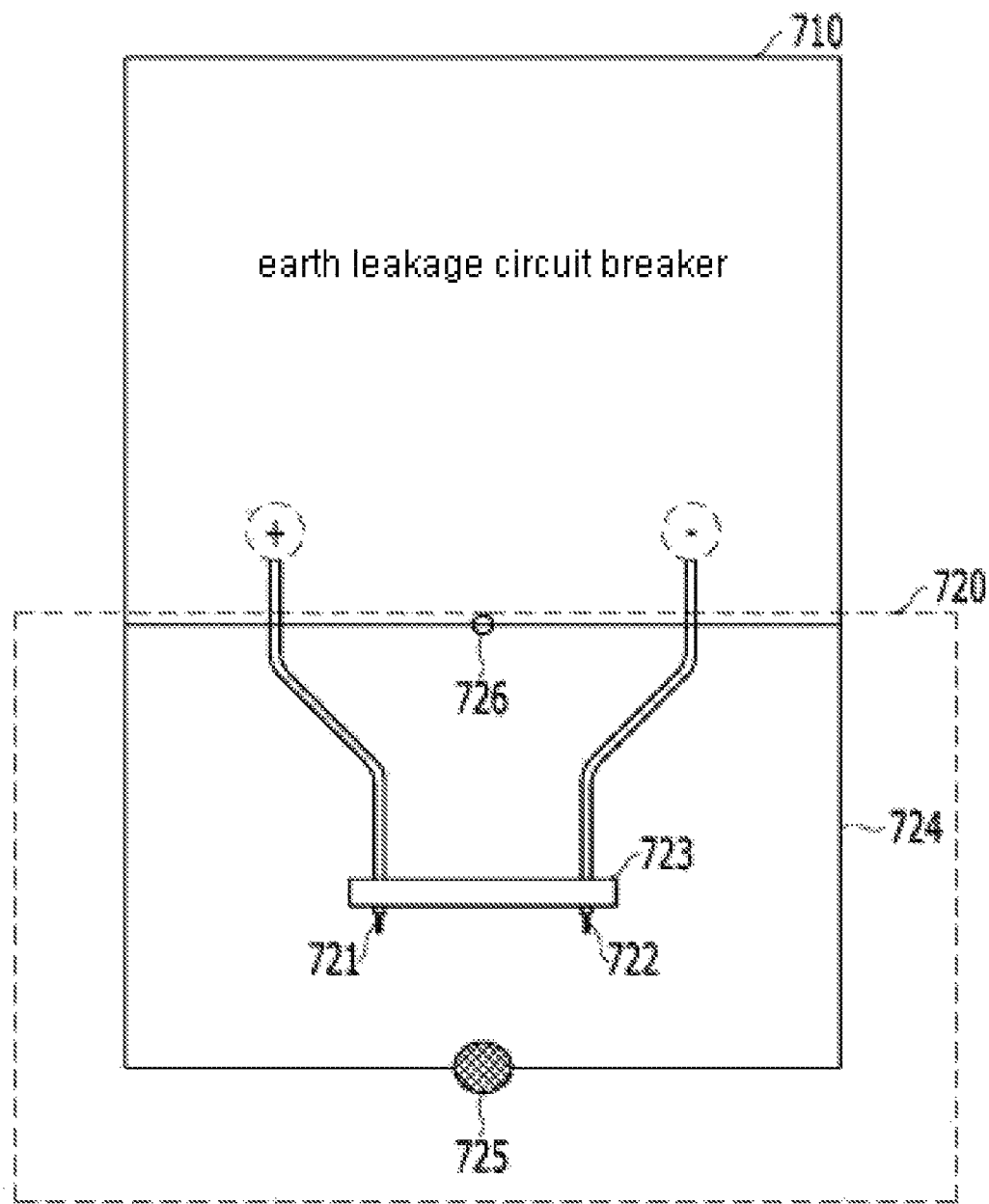
FIG. 7 is a view to explain a means preventing an operation of a conventional earth leakage circuit breaker.
Figure 8:
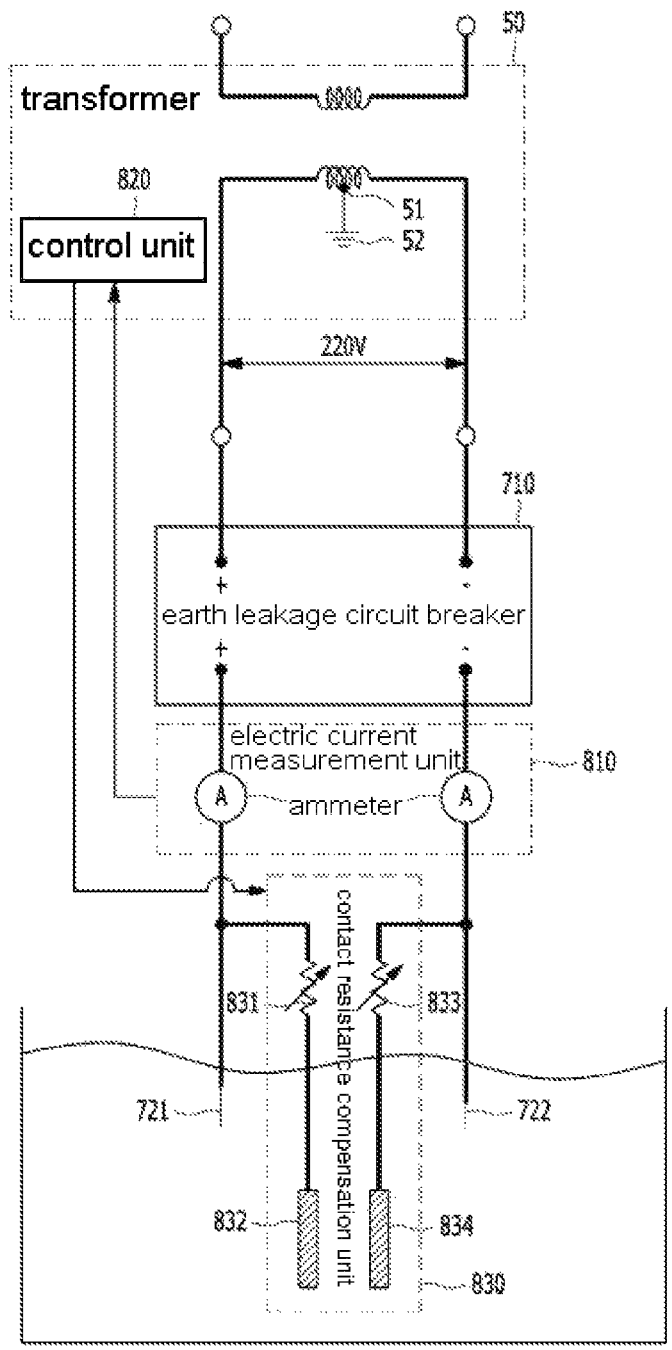
FIG. 8 is a view to explain an apparatus for preventing electric shock in an event of flooding according to a first embodiment of this invention.

FIG. 8 is a view illustrating an apparatus for preventing electric shock in an event of flooding according to a first embodiment of this invention.

As illustrated in FIG. 8, the apparatus for preventing electric shock in an event of flooding according to the first embodiment of this invention compensates for the difference in contact resistance arising from the difference in surface area of exposed terminals 721 and 722 of electrical equipment while using the neutral grounding system in the single-phase two-wire low-voltage power distribution system.

That is, the apparatus for preventing electric shock in an event of flooding according to the first embodiment of this invention can prevent occurrence of a leakage current, thus fundamentally prevent electric shock when there is a potential of a leakage current due to a difference in surface area of the two exposed terminals 721 and 722 by the following: sensing a leakage current by using measured value of a current at the current measurement unit 810 prior to the actuation of the earth leakage circuit breaker; and adjusting the contact resistance of the two exposed terminals 721 and 722 to be nearly same value through compensation via contact resistance compensation unit for the difference in contact resistance arising from the difference in surface area of exposed terminals 721 and 722.

For this, the apparatus for preventing electric shock in an event of flooding according to the first embodiment of this invention includes: a transformer 50 supplying a voltage by using a neutral grounding system in a single-phase two-wire low-voltage power distribution system; an earth leakage circuit breaker 710 connected to power supply lines from the transformer 50; an electric current measurement unit 810 measuring the amount of electric current passing through the earth leakage circuit breaker 710; a control unit 820 outputting a control signal corresponding to a contact resistance to be compensated for the contact resistance being calculated by using the amount of electric current output from the electric current measurement unit 810; and a contact resistance compensation unit 830 compensating for the contact resistance in response to the control signal from the control unit.

At this time, the transformer 50 uses the single-phase two-wire low-voltage power distribution system comprising a single-phase (1P) input side and a two-wire output side, and uses a neutral grounding system in which a neutral point 51 (middle position of a secondary winding) of a secondary winding (winding of the output side) is connected to a ground wire 52.

In addition, the earth leakage circuit breaker 710 is a wiring appliance that automatically cuts the electricity by sensing a state, in advance, that an input voltage higher than the nominal voltage is applied or earth leakage occurs at the electrical equipment.

In addition, an electric current measurement unit 810 measures the amounts of two electric currents (the amount of electric current flowing the plus line and minus line, each) passing through the earth leakage circuit breaker 710 and outputs them to the control unit 820; or the electric current measurement unit 810 can be materialized to calculate the difference in two of the amount of electric current and transmits the result to the control unit 820. At this time, the electric current measurement unit 810 can be materialized by using two ammeters connected to plus and minus lines one to one, specifically at the downstream of the earth leakage circuit breaker 710; at the upstream of the earth leakage circuit breaker 710 (i.e., between the transformer 50 and the earth leakage circuit breaker 710), or inside the earth leakage circuit breaker 710, as illustrated in FIG. 8.

In addition, the control unit 820, by using the amount of electric current output from the electric current measurement unit 810 calculates the contact resistance to be compensated by the contact resistance compensation unit 830; and outputs a control signal corresponding to the calculated contact resistance to the contact resistance compensation unit 830.

At this time, the control unit 820 can be materialized to calculate the contact resistance to be compensated by the contact resistance compensation unit 830 after calculating the difference of the values by receiving two of the amount of electric current, or to yield the contact resistance to be compensated by the contact resistance compensation unit 830 by receiving the difference of the two values of the amount of electric current, from the electric current measurement unit 810. Meanwhile, the control signal is the one to compensate for the contact resistance of the side that has larger contact resistance out of the exposed terminals 721 and 722. Furthermore, the control unit 820 can be materialized, as illustrated in FIG. 8 inside the transformer 50, inside the earth leakage circuit breaker 710, preferably, inside the electric current measurement unit 810, or at an outside place.

In addition, the contact resistance compensation unit 830 compensates for the contact resistance of the side that has larger contact resistance out of the exposed terminals 721 and 722 in response to the control signal from the control unit 820. At this time, the contact resistance compensation unit 830 includes contact resistance regulators 831 and 833 regulating the contact resistance by varying the resistance value in response to the control signal from the control unit 820; and contact resistance compensation terminals 832 and 834 compensating for the contact resistance (exposed area), wherein the terminals are connected to the contact resistance regulators 831 and 833, respectively. Here, the contact resistance regulators 831 and 833 can be materialized with variable resistance as an example, and it is desirable that the contact resistance compensation terminals 832 and 834 are disposed at the position lower than the exposed terminals 721 and 722 to be prepared for the event in flooding.

Figure 9:
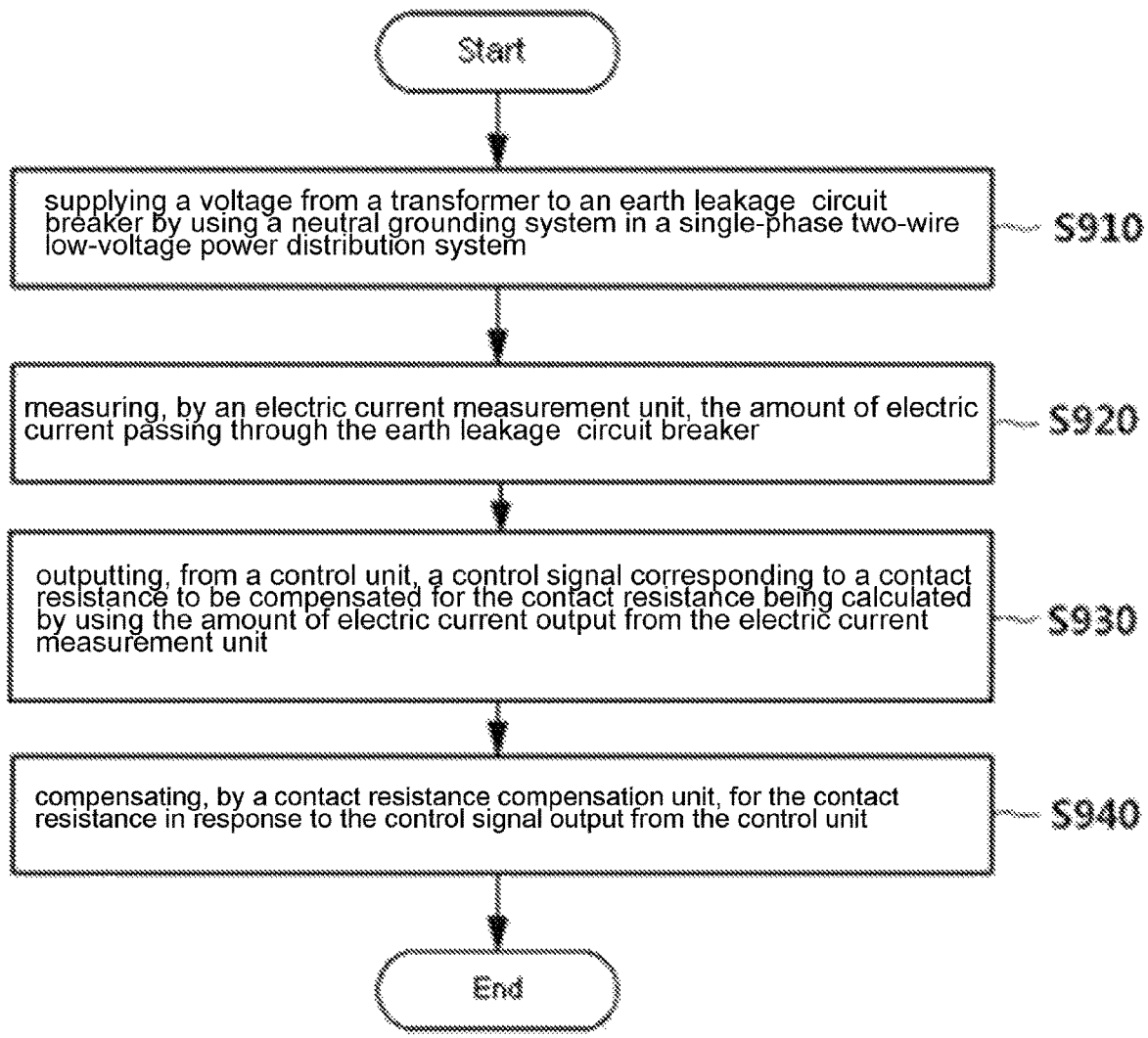
FIG. 9 is an overall flowchart about a method of preventing electric shock in an event of flooding according to a second embodiment of this invention.

Meanwhile, since FIG. 9 is a flowchart about a method of preventing electric shock in an event of flooding according to the second embodiment of this invention, and the specific embodiment thereof will be described in detail in the description about the apparatus for preventing electric shock in an event of flooding of FIG. 8, and its operational process will be briefly described here.

First, the earth leakage circuit breaker 710 is supplied a voltage from the transformer 50 that is using the neutral grounding system in the single-phase two-wire low-voltage power distribution system (S910).

Next, the electric current measurement unit 810 measures the amount of electric current passing through the earth leakage circuit breaker 710 (S920).

Next, the control unit 820 calculates the contact resistance to be compensated for by using the amount of electric current from the electric current measurement unit 810 and outputs a corresponding control signal (S930).

Then, the contact resistance compensation unit 830 compensates contact resistance in response to a control signal from the control unit 820 (S940).

Figure 10:
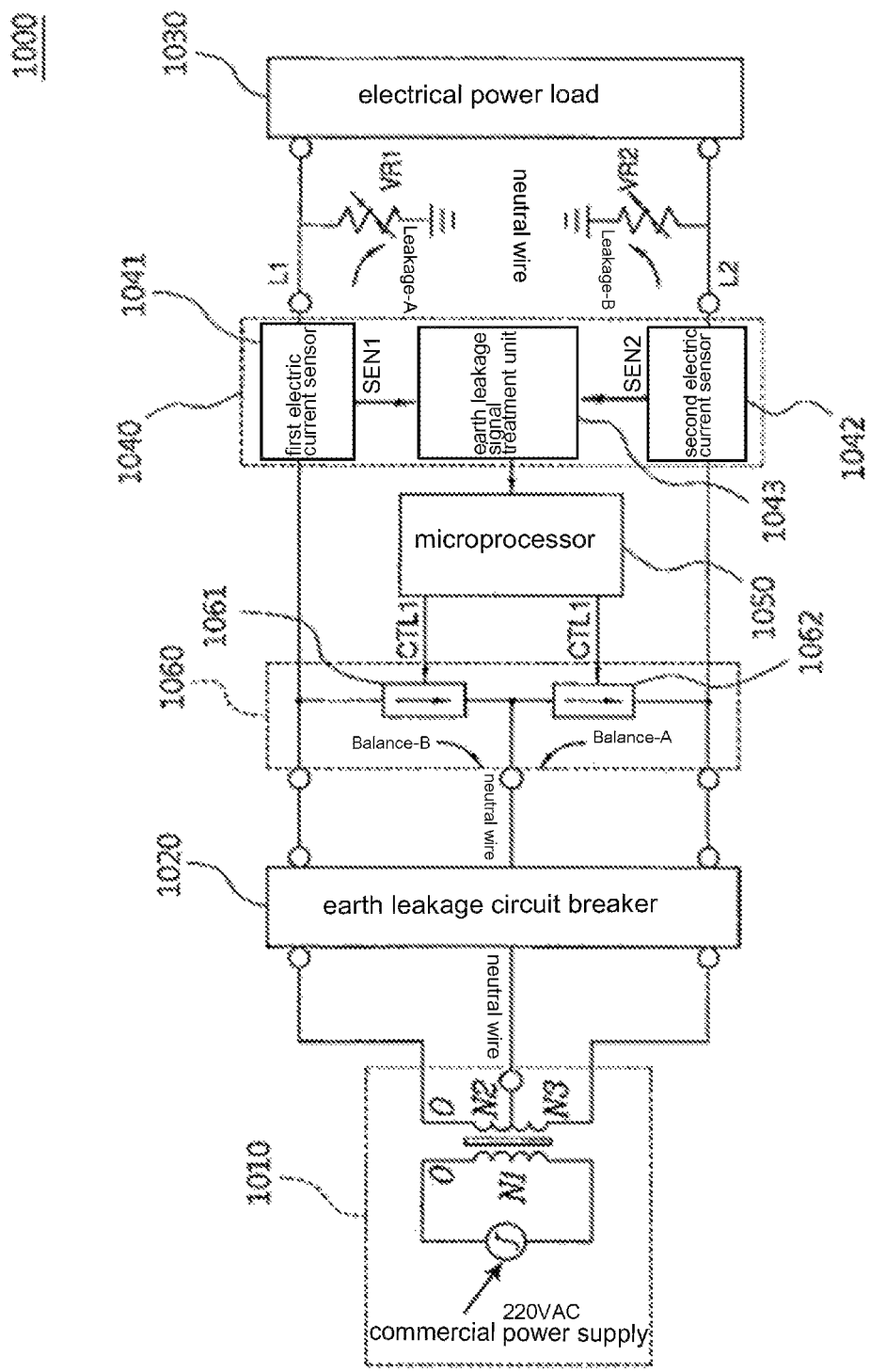
FIG. 10 is a view to explain an apparatus for preventing electric shock in an event of flooding according to a third embodiment of this invention.

Meanwhile, FIG. 10 is a view to explain an apparatus for preventing electric shock in an event of flooding according to the third embodiment of this invention and the apparatus 1000 for preventing electric shock includes a transformer 1010, an earth leakage circuit breaker 1020, electrical power load 1030, an earth leakage sensor unit 1040, a microprocessor, and a balance switching unit 1060.

The transformer 1010 is the transformer of the single-phase two-wire low-voltage power distribution system composed a the single-phase (1P) input side and a two-wire output side, wherein a neutral grounding system is used by connecting a neutral point (middle position of a secondary winding) of a secondary winding (winding of the output side) to a ground wire. The power supply from the transformer 1010 is supplied to the electrical power load 1030 through the earth leakage circuit breaker and the power supply lines L1 and L2, wherein each of the first and the second power supply lines is provided with a connection terminal connected thereto.

In the case that no earth leakage occurs in the first power supply line L1 or the second power supply line L2, or an earth leakage less than the predetermined baseline occurs, the microprocessor 1050 is placed in a standby status. That is, in a normal status, a leakage resistance VR1 between the first power supply line L1 and the neutral wire connected to the neutral point and a leakage resistance VR2 between the second power supply line L2 and the neutral wire connected to the neutral point are maintained at the same value equal to or higher than a certain value, thus, are placed in a standby status, wherein the leakage resistance VR1 and VR2 are not manmade but are ones that exist naturally between the power supply lines L1 and L2 and the neutral wire.

Whatever the reason, however, in the case that earth leakage equal to or greater than the predetermined baseline occurs in the first power supply line L1 or the second power supply line L2, for example, in the case that earth leakage equal to or greater than the predetermined baseline occurs in the first power supply line L1, trip operation of the earth leakage circuit breaker 1020 is to be delayed by controlling the amount of a leakage current of the second power supply line L2. The processing operation like this will be described as follows.

The earth leakage circuit breaker 1020 plays a role to cut electrical power supply supplied from the transformer 1010 to electric power load 1030 through the power supply lines L1 and L2 by sensing a voltage equal to or greater than the nominal voltage is applied to the apparatus 1000 for preventing electric shock or the occurrence of a earth leakage.

The earth leakage sensor unit 1040 senses the amount of electric current flowing in the power supply lines L1 and L2 and outputs earth leakage sensing signals SEN1 and SEN2 accordingly. To do this, the earth leakage sensor unit 1040 is equipped with a first electric current sensor 1041 installed on the first power supply line L1, a second electric current sensor 1042 installed on the second power supply line L2, and earth leakage sensing signal treatment unit 1043. The first electric current sensor 1041 senses the amount of electric current flowing in the power supply line L1 and outputs earth leakage sensing signal SEN1 accordingly. In the same manner, the second electric current sensor 1042 senses the amount of electric current flowing in the power supply line L2 and outputs earth leakage sensing signal SEN2 accordingly. The earth leakage sensing signal treatment unit 1043 plays a role to output the first and second earth leakage sensing signals SEN1 and SEN2 by transforming into signals of appropriate form for the treatment in the microprocessor 1050.

The microprocessor 1050 controls the balancing operation of the power supply lines L1 and L2 by identifying the occurrence of a earth leakage on the first power supply line L1 or on the second power supply line L2, based on the earth leakage sensing signals SEN1 and SEN2 being input via the paths as above. For example, in the case that earth leakage equal to or greater than the predetermined baseline occurs in the first power supply line L1 as above, the microprocessor 1050 identifies that the amount of electric current flowing in the power supply lines L1 is less than the amount of a leakage current of the power supply lines L1 compared with the amount of electric current flowing in the power supply lines L2. In the case like this, the microprocessor 1050 outputs the second control signal CTL2 corresponding to the amount of the leakage current. The balance switching unit 1060 maintains electric current balancing between the first and the second power supply lines L1 and L2 by controlling the amount of electric current of the first power supply line L1 or the second power supply line L2 via switching operation according to the first control signal CTL1 or the second control signal CTL2.

The balance switching unit 1060 maintains balancing of the amount of electric current between the first and the second power supply lines L1 and L2 by controlling the amount of electric current of the first power supply line L1 or the second power supply line L2 via switching operation according to the first control signal CTL1 or the second control signal CTL2. To do this, the balance switching unit 1060 is equipped with a first balance switching circuit 1061 and a second balance switching circuit 1062. Like the example above, in the case that the microprocessor 1050 outputs the second control signal CTL2 when a earth leakage occurs in the first power supply line L1, the second balance switching circuit 1062, by controlling the conducting period of an internal active element such as triac switch, for example, according to the second control signal CTL2, actuates to flow an electric current from the second power supply line L2 to neutral wire, wherein the electric current is as much as the amount of the leakage current of the first power supply line L1. In the case like this, the first and the second control signals CTL1 and CTL2 can be materialized in a type of pulse width modulation (PWM)

Consequently, in the case that earth leakage equal to or greater than the predetermined baseline occurs in the first power supply line L1 as above, electric current balancing between the two power supply lines L1 and L2 is established via the coordination of the amount of a leakage current of the second power supply line L2, before the earth leakage circuit breaker 1020 reaches the actuation point by the second balance switching circuit 1062. Accordingly, trip actuation of the earth leakage circuit breaker 1020 is delayed.

As another example, in the case that earth leakage equal to or greater than the predetermined baseline occurs in the first power supply line L2, electric current balancing between the two power supply lines L1 and L2 is established through the coordination of the amount of a leakage current of the first power supply line L1, before the earth leakage circuit breaker 1020 reaches the actuation point by the first balance switching circuit 1061 through the treatment process as above. Accordingly, trip actuation of the earth leakage circuit breaker 1020 is delayed.

In order for the electric current balancing operation to be smoothly established when the apparatus 1000 for preventing electric shock is immersed into water, it is desirable that the two power supply lines L1 and L2 are located at the lower part compared with the earth leakage sensor unit 1040.

Figure 11:
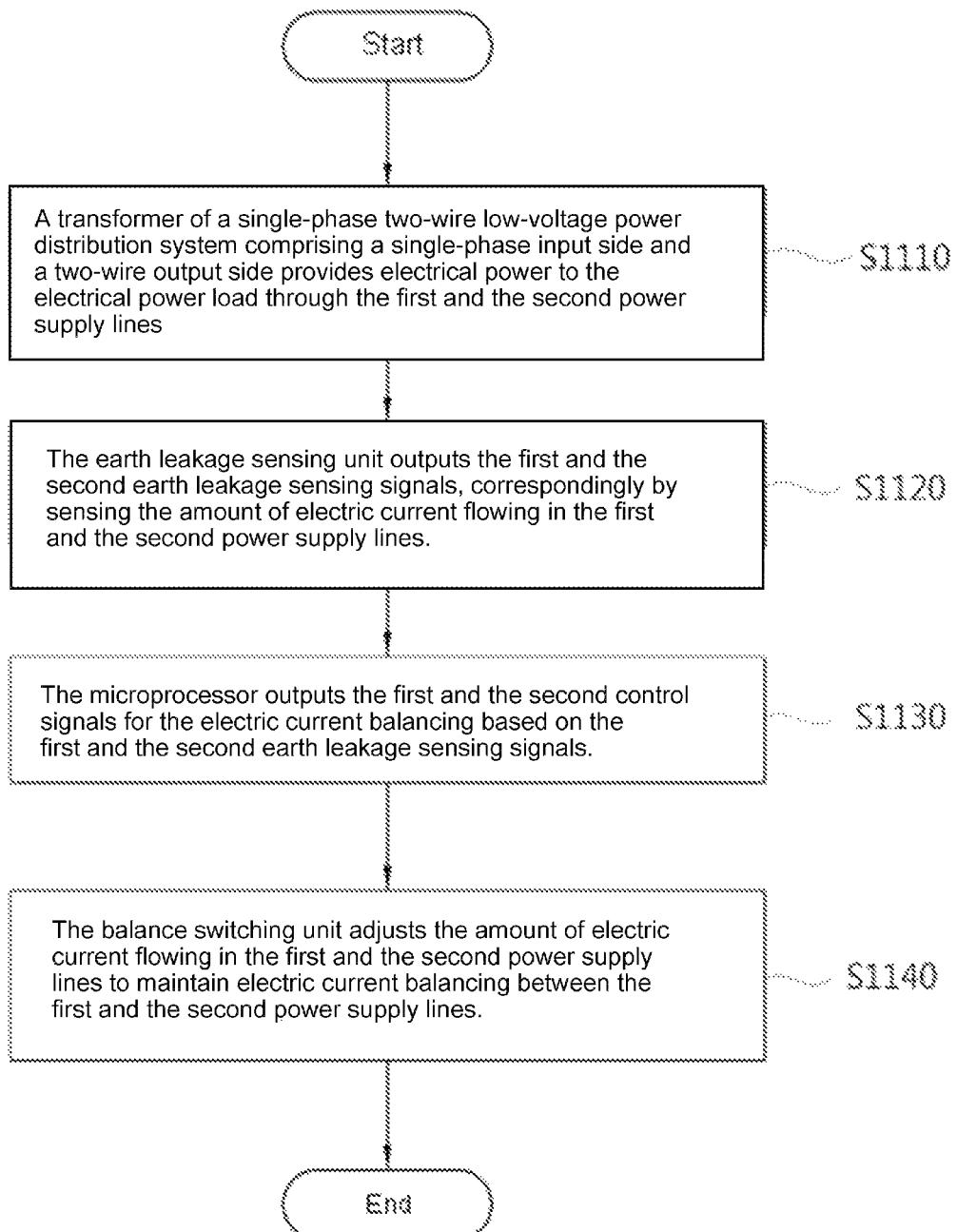
FIG. 11 is an overall flowchart about a method of preventing electric shock in an event of flooding according to a fourth embodiment of this invention.

Meanwhile, FIG. 11 is an overall flowchart about a method of preventing electric shock in an event of flooding according to a fourth embodiment of this invention, and treatment process thereof will be described hereinbelow with reference to the operation description of the apparatus 1000 for preventing electric shock.

A transformer of a single-phase two-wire low-voltage power distribution system comprising a single-phase (1P) input side and a two-wire output side and uses a neutral grounding system in which a neutral point (middle position of a secondary winding) of a secondary winding is connected to a ground wire, and the transformer provides electrical power supply necessary for the electrical power load through the earth leakage circuit breaker and the first and the second power supply lines (S1110).

The earth leakage sensing unit senses the occurrence of earth leakage in the first and the second power supply lines and outputs the first earth leakage sensing signal or the second earth leakage sensing signal, correspondingly (S1120).

The microprocessor outputs the first control signal CTL1 or the second control signal CTL2 to control the electric current balancing operation of the power supply lines L1 and L2 by identifying the occurrence of a earth leakage on the first power supply line L1 or on the second power supply line L2, based on the earth leakage sensing signals SEN1 and SEN2 (S1130).

The balance switching unit maintains electric current balancing between the first and the second power supply lines L1 and L2 by controlling the amount of electric current flowing to the neutral point from the first power supply line via switching operation in response to the first control signal or by controlling the amount of electric current flowing to the neutral point from the second power supply line via switching operation in response to the second control signal (S1140).

Accordingly, even though a leakage current equal to or greater than a certain level flows following the occurrence of a earth leakage in the first power supply line, or in the second power supply line, trip actuation of the earth leakage circuit breaker is delayed and an electric shock accident does not occur.

Although present invention is described with limited embodiments and FIGS as above, this invention is not limited to the embodiments, and those skilled in the art will appreciate that various substitutions, change, and modification are possible, without departing from the scope and spirit of the present invention. Therefore, the scope of the present invention should not be limited to the embodiments described, but should be defined not only by the claims to be described later but also by those equivalent to claims.

The invention claimed is:

1. An apparatus for preventing electric shock in an event of flooding, the apparatus comprising:
    a transformer supplying a voltage by using a neutral grounding system in a single-phase two-wire low-voltage power distribution system;
    an earth leakage circuit breaker connected to power supply lines extending from the transformer;
        an electric current measurement unit measuring the amount of electric current passing through the earth leakage circuit breaker;
    a control unit outputting a control signal corresponding to a contact resistance to be compensated for the contact resistance being calculated by using the amount of electric current output from the electric current measurement unit; and
    a contact resistance compensation unit compensating for the contact resistance in response to the control signal output from the control unit.

2. The apparatus of claim 1, wherein the contact resistance compensation unit comprises:
    a contact resistance regulator regulating the contact resistance value by varying a resistance value in response to the control signal output from the control unit; and
    a contact resistance compensation terminal connected to the contact resistance regulator and compensating for the contact resistance.

3. A method of preventing electric shock in an event of flooding, the method comprising the steps of:

supplying a voltage from a transformer to an earth leakage circuit breaker by using a neutral grounding system in a single-phase two-wire low-voltage power distribution system;

measuring, by an electric current measurement unit, the amount of electric current passing through the earth leakage circuit breaker;

outputting, from a control unit, a control signal corresponding to a contact resistance to be compensated for the contact resistance being calculated by using the amount of electric current output from the electric current measurement unit; and compensating, by a contact resistance compensation unit, for the contact resistance in response to the control signal output from the control unit.

4. An apparatus for preventing electric shock in an event of flooding, the apparatus comprising:

a transformer supplying power to electrical power load via an earth leakage circuit breaker and first and second power supply lines, wherein the transformer uses a single-phase two-wire low-voltage power distribution system comprising a single-phase input side and a two-wire output side, and uses a neutral grounding system in which a neutral point of a secondary winding is connected to a ground wire;

the earth leakage circuit breaker cutting the power supply to the electric power load by sensing that an input voltage equal to or greater than a nominal voltage is applied or earth leakage occurs;

an earth leakage sensing unit outputting first and second earth leakage sensing signals corresponding to the amount of electric current, sensed by the sensing unit, flowing in the first and the second power supply lines;

a microprocessor outputting first and second control signals in order to maintain electric current balancing between the first and the second power supply lines based on the first and the second earth leakage sensing signals; and a balance switching unit maintaining the electric current balancing between the first and the second power supply lines by controlling the amount of electric current of the first power supply line or the second power supply line via switching operation in response to the first control signal or the second control signal.

5. The apparatus of claim 4, wherein the earth leakage sensing unit comprises:

a first electric current sensor sensing the amount of electric current flowing in the first power supply line and outputting the first earth leakage sensing signal corresponding to the amount of electric current flowing in the first power supply line;

a second electric current sensor sensing the amount of electric current flowing in the second power supply line and outputting the second earth leakage sensing signal corresponding to the amount of electric current flowing in the second power supply line; and an earth leakage sensing signal treatment unit outputting the first and the second earth leakage sensing signals by transforming the sensing signals into signals of an appropriate form for the treatment in the microprocessor.

6. The apparatus of claim 4, wherein the balance switching unit comprises:

a first balance switching circuit allowing flow of the electric current in the neutral wire connected to the neutral point from the first power supply line to be as much as the amount of leakage current of the second power supply line by controlling a first internal switching element in response to the first control signal; and a second balance switching circuit allowing flow of the electric current in the neutral wire connected to the neutral point from the second power supply line to be as much as the amount of leakage current of the first power supply line by controlling a second internal switching element in response to the second control signal.

7. The apparatus of claim 6, wherein the first and the second switching elements are triac switches.

8. The apparatus of claim 4, wherein the first and the second control signals are pulse width modulation signals.

9. The apparatus of claim 4, wherein each of the first and the second power supply lines is provided with a connection terminal connected thereto.

10. A method of preventing electric shock in an event of flooding, the method comprising the steps of:

(a) supplying power from a transformer to an electric power load via an earth leakage circuit breaker and first and second power supply lines, wherein the transformer uses a single-phase two-wire low-voltage power distribution system comprising a single-phase input side and a two-wire output side, and uses a neutral grounding system in which a neutral point of a secondary winding is connected to a ground wire;

(b) outputting, from an earth leakage sensing unit, first and second earth leakage sensing signals corresponding to the amount of electric current, sensed by the sensing unit, flowing in the first and the second power supply lines;

(c) outputting, from a microprocessor, first and second control signals in order to maintain electric current balancing between the first and the second power supply lines based on the first and the second earth leakage sensing signals; and (d) maintaining, by a balance switching unit, the electric current balancing between the first and the second power supply lines by controlling the amount of electric current of the first power supply line or the second power supply line via switching operation in response to the first control signal or the second control signal.

* * * * *